US009933605B2

(12) United States Patent
Rousseau et al.

(10) Patent No.: US 9,933,605 B2
(45) Date of Patent: Apr. 3, 2018

(54) LASER-PUMPED HIGH-RADIANCE INCOHERENT LIGHT SOURCE

(71) Applicant: Optomak, Inc., Quebec (CA)

(72) Inventors: Guy Rousseau, L'Ancienne-Lorette (CA); Sead Doric, L'Ancienne-Lorette (CA)

(73) Assignee: OPTOMAK, INC. (CA)

( * ) Notice: Subject to any disclaimer, the term of this patent is extended or adjusted under 35 U.S.C. 154(b) by 725 days.

(21) Appl. No.: 14/538,026

(22) Filed: Nov. 11, 2014

(65) Prior Publication Data

US 2016/0131334 A1 May 12, 2016

(51) Int. Cl.
| | |
|---|---|
| *G01N 21/25* | (2006.01) |
| *G02B 19/00* | (2006.01) |
| *F21V 8/00* | (2006.01) |
| *G02B 27/09* | (2006.01) |
| *H01S 5/00* | (2006.01) |
| *H01S 5/40* | (2006.01) |

(52) U.S. Cl.
CPC ....... *G02B 19/0028* (2013.01); *G02B 6/0006* (2013.01); *G02B 6/0008* (2013.01); *G02B 19/0014* (2013.01); *G02B 19/0052* (2013.01); *G02B 27/0916* (2013.01); *H01S 5/005* (2013.01); *H01S 5/4025* (2013.01)

(58) Field of Classification Search
CPC ............ G02B 19/0028; G02B 19/0014; G02B 19/0052; G02B 6/0006; G02B 6/0008; G02B 27/0916
See application file for complete search history.

(56) References Cited

U.S. PATENT DOCUMENTS

| 6,834,064 B1 | 12/2004 | Paschotta et al. |
| 8,625,097 B2 | 1/2014 | Brukilacchio et al. |
| 2009/0040754 A1* | 2/2009 | Brukilacchio ....... A61B 1/0653 362/228 |
| 2009/0059359 A1* | 3/2009 | Nahm ................ A61B 1/00165 359/368 |

(Continued)

OTHER PUBLICATIONS

Denault, et al., "Efficient and stable laser-driven white lighting", AIP Advances 3, 072107, Jul. 2013, 7 pages (pp. 1-7 in pdf), AIP Publishing, NY, US.

(Continued)

*Primary Examiner* — Anabel Ton
(74) *Attorney, Agent, or Firm* — Mitch Harris, Atty at Law, LLC; Andrew M. Harris

(57) ABSTRACT

A high-radiance broadband incoherent light source is provided by pumping a body formed from a doped material, such as a Ce:YAG crystal with one or more laser diodes. The laser diodes emit at a stimulus wavelength, which may be an absorption wavelength of the body, and the body fluoresces to emit broadband light in a wide emission band. The body is either disposed in, or forms a light-concentrating cavity, e.g., reflective surfaces, which may be dichroic surfaces, can be formed on or attached to the sides of the body to concentrate the emitted light. The light is captured by a light collector that is coupled to an output face of the body to produce a broadband illumination beam. One or more of the reflective surfaces forming the light-concentrating cavity may form a heat sink.

27 Claims, 6 Drawing Sheets

(56) References Cited

U.S. PATENT DOCUMENTS

2013/0336347 A1    12/2013    Aubry et al.

OTHER PUBLICATIONS

"Product Sheet: EQ-99XFC LDLS Compact, Long-Life, High-Brightness, Broadband Laser-Driven Light Source with Fiber-Coupled Output", Energetiq Technology, Inc., downloaded from: http://www.energetiq.com/fiber-coupled-laser-driven-light-source-long-life-compact.php on Nov. 11, 2014, 2 pages (pp. 1-2 in pdf).
Liu, et al., "Spatially coherent white-light interferometer based on a point fluorescent source", Optics Letters, May 1993, pp. 678-680, vol. 18, No. 9, Optical Society of America, US.
"OSL2 High-Intensity Fiber Light Source: User Guide", Thorlabs, CTN002086-D02, Rev A, Jan. 15, 2014, 12 pages (pp. 1-12 in pdf), Thorlabs, Inc., Newton, NJ, US.
Tsai, et al., "$Ce^{3+}$: YAG double-clad crystal-fiber-based optical coherence tomography on fish cornea", Optics Letters, Mar. 2010, pp. 811-813, vol. 35, No. 6, Optical Society of America, US.
Tuite, Don, "Blend Blue LEDS and Phosphors to Make HB LEDs", Electronic Design, May 2013, pp. 42-44, Penton Electronics Group, US.
Vatnik, et al., "Efficient thin-disk Tm-laser operation based on $Tm:KLu(WO_4)_2/KLu(WO_4)_2$ epitaxies", Optics Letters, Feb. 2012, pp. 356-358, vol. 37, No. 3, Optical Society of America, US.
"Product Sheet: WLS1000 Fibre-coupled White Light Source", Bentham Instruments Ltd., downloaded from: http://www.bentham.co.uk/wls100.htm on Oct. 1, 2014, 2 pages (pp. 1-2 in pdf).
"Advertisement: Broadband Fiber-Coupled Light Sources", Edmund Optics Inc., downloaded from http://www.edmundoptics.com/testing-targets/spectrometers/broadband-fiber-coupled-light-sources/3575 on Oct. 1, 2014.

\* cited by examiner

LASER-PUMPED HIGH-RADIANCE INCOHERENT LIGHT SOURCE

BACKGROUND OF THE INVENTION

1. Field of the Invention

The present invention is related generally to optical sources, and in particular to a high radiance incoherent light source for coupling to an optical fiber.

2. Background of the Invention

In biomedical applications, as well as other applications requiring stimulation of fluorescence or other similar illumination requirements, a broadband optical source is typically needed, as the speckle field generated by narrowband illumination makes narrowband illumination unsuitable for many biomedical and imaging applications, such as optogenetics applications. Historical broadband incoherent light sources require relatively large optical systems and reflectors to concentrate light in a narrow beam in order to provide an efficient source of illumination, and to provide high intensity when coupling into a waveguide such as an optical fiber.

Existing broadband solid state sources such as broadband light-emitting diodes (LEDs) such as those used for general illumination are attractive for providing efficient and compact broadband illumination sources. Semiconductor lasers are often used as narrowband optical sources and produce narrow beams suitable for coupling to an optical waveguide. However, present-day broadband ("white") LEDs are in fact LED-stimulated fluorescent crystals that do not produce narrow beams and have relatively low radiance, making them generally unsuitable for introducing high-radiance illumination to an optical fiber. The LEDs used to stimulate the crystals are typically blue LEDs that stimulate a Ce:YAG crystal located within a diffusing broadband cavity.

Therefore, it would be desirable to provide an optical source having the advantages of solid state sources, while providing a compact high-radiance source of broadband light that can be coupled to an optical fiber.

SUMMARY OF THE INVENTION

The invention includes a broadband high-radiance optical source and a method of generating broadband incoherent light suitable for introduction of the light to an optical fiber.

The optical source includes a body formed from a doped material that fluoresces when stimulated at a stimulus wavelength. The body either forms a light-concentrating cavity, or is disposed in a light-concentrating cavity. The optical source also includes one or more laser diodes for producing stimulus beams at the stimulus wavelength, which are directed at the body to cause the body to emit light in an emission band. The optical source also includes a light collector coupled to a face of the body to produce a broadband illumination output beam by collecting at least a portion of the light emitted by the body.

The light-concentrating cavity may be formed on the sides of the body by attaching or depositing a reflective material, at least one side of which may also provide a heat sink for cooling the body. The reflective material may be a dichroic material that is reflective over the emission band, but transparent in the stimulus band, so that the stimulus beams can be introduced through the side(s) of the body.

The foregoing and other objectives, features, and advantages of the invention will be apparent from the following, more particular, description of the preferred embodiment of the invention, as illustrated in the accompanying drawings.

BRIEF DESCRIPTION OF THE DRAWINGS

The novel features believed characteristic of the invention are set forth in the appended claims. The invention itself, however, as well as a preferred mode of use, further objectives, and advantages thereof, will best be understood by reference to the following detailed description of an illustrative embodiment when read in conjunction with the accompanying drawings, wherein like reference numerals indicate like components, and:

DESCRIPTION OF ILLUSTRATED EMBODIMENT

The present invention encompasses broadband high-radiance light sources and techniques of generating broadband light that use a laser-pumped body having fluorescent properties, such as a crystal, polycrystal or amorphous material that has been doped with a doping agent, such as a Cerium-doped Yttrium Aluminum Garnet (Ce:YAG) solid-state crystal matrix. The broadband high-radiance light source is well-suited for providing a high-intensity broadband input to an optical fiber via a fiber optic coupler or permanently mounted fiber end. Very high radiance (in W/m$^2$/sr) laser diodes having an emission wavelength of approximately 450±10 nm are now available at low cost. Ce:YAG material has an absorption band with a peak wavelength at 460 nm, with half maximum width of approximately 40 nm or +/−20 nm. Consequently, the absorption at 450 nm, which is the stimulus wavelength in the examples given below, is approximately 90% of the peak absorption at 460 nm, and lies within the absorption band of the Ce:YAG material, i.e., 460 nm+/−20 nm, which is an absorption band of 440 nm to 480 nm at half-maximum absorption. Thus, the characteristics of Ce:YAG provide for efficient laser diode pumping of Ce:YAG crystals, although the present invention is not limited to a laser-pumped body fabricated from Ce:YAG, but extends to other materials having fluorescent properties that will generate high-radiance broadband light when stimulated by laser pumps. In some embodiments of the invention, the laser pumps are laser diodes that can be intensity-modulated by varying their drive current over a range for which their change in emitted power is substantially linear with respect to the variation in drive current. Since the intensity of the fluorescence emission is proportional to the pump laser intensity, and since the fluorescence lifetime is negligible in many applications (e.g., 70 ns for Ce:YAG), for modulation in the frequency range generally used in optogenetics and biomedical imaging (e.g., rise and fall times of 1 ms), modulating the pump laser intensity proportionately modulates the intensity of the broadband high-radiance light source. By increasing the number of pump lasers, the total pump power can be increased. Since each pump beam does not require a large optical etendue, many pump lasers can be distributed around the normal to the front surface of the crystal or to the input facet of a crystal waveguide.

Figure 1:
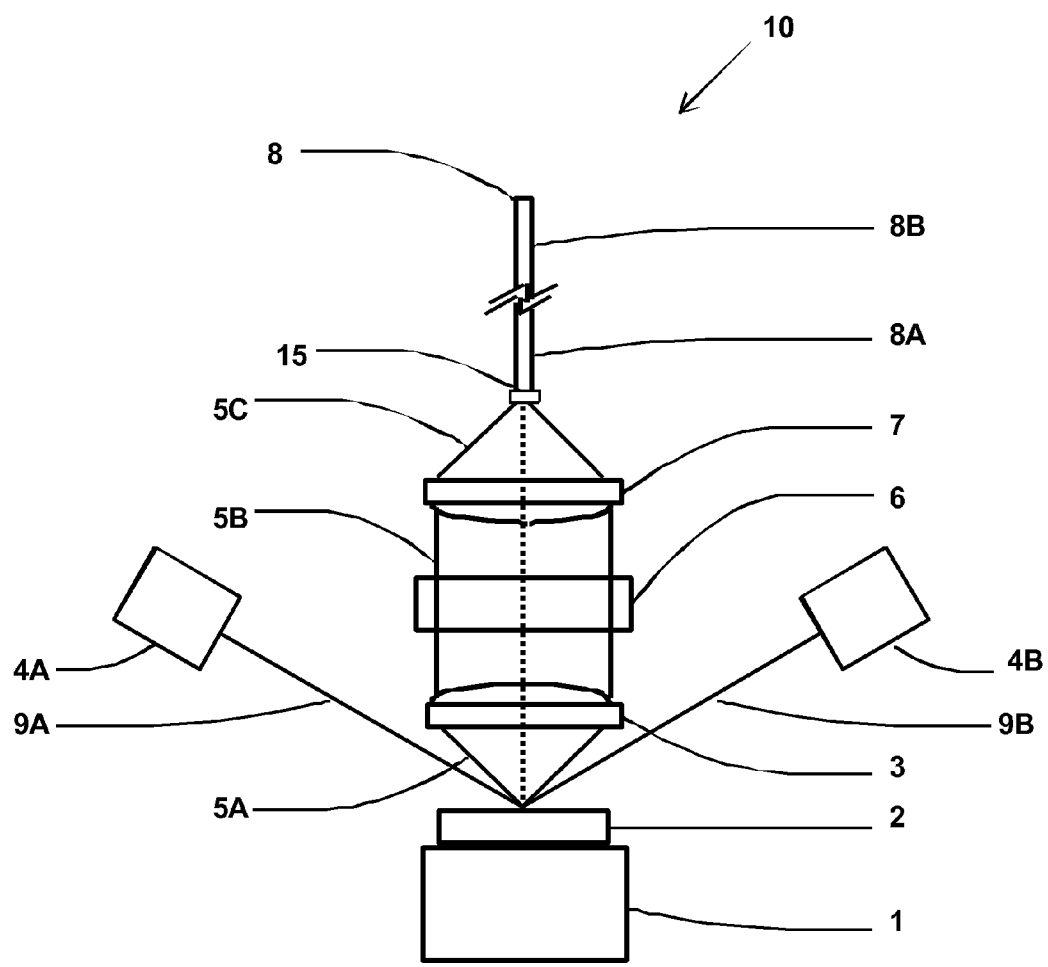
FIG. 1 is a block diagram depicting an exemplary broadband light source 10.
Figure 2:
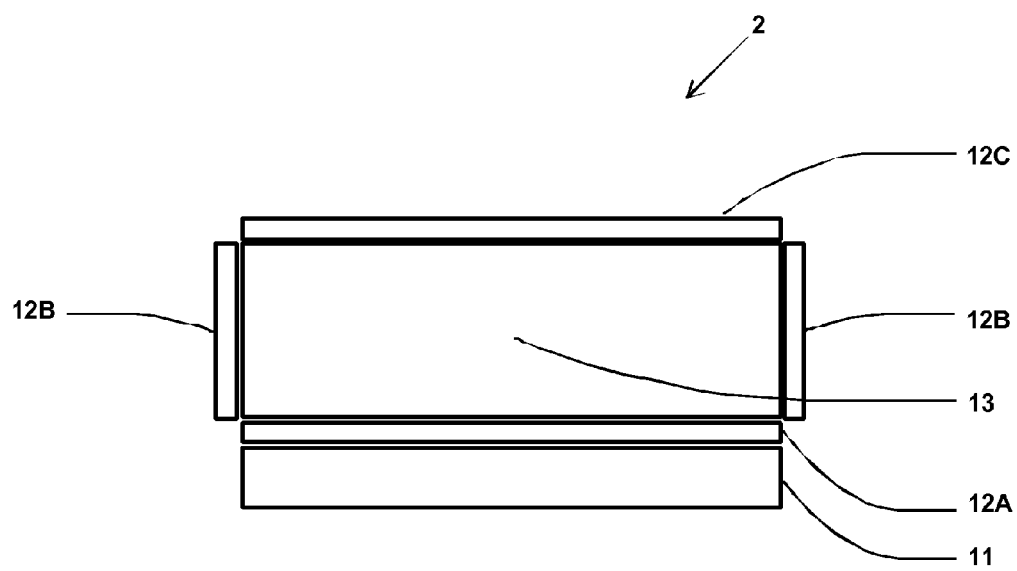
FIG. 2 is a block diagram depicting details of crystal assembly 2 of broadband light source 10 of FIG. 1.

Referring to FIG. 1, a broadband light source 10 is illustrated in accordance with an embodiment of the invention. Light source 10 generates broadband light from a body having fluorescent characteristics at an emission wavelength that forms or is disposed within a light-emitting assembly 2, further details of which will be described below. A heat sink 1 is included to cool the body, so that the fluorescent characteristics of which are not degraded by heat. A pair of pump laser assemblies 4A, 4B direct corresponding optical stimulus beams 9A, 9B at light-emitting assembly 2 (i.e., without using an intervening waveguide coupling pump laser assemblies 4A,4B to light-emitting assembly 2) to cause the body within light-emitting assembly 2 to fluoresce, emitting broadband light. Optical stimulus beams 9A, 9B are thus directed at, and strike a top face of light-emitting assembly 2 and a top face of crystal 13 as shown in FIG. 2 described below. The emitted light, which forms a divergent light beam 5A, is collected by a light collector provided by collimating optics 3, to form a collimated light beam 5B, is optionally filtered by an optical filter 6 and is focused by focusing optics 7 to form a focused light beam 5C. Focused light beam 5C is provided to a proximal end 8A of optical fiber 8. A fiber coupler or connector 15 may be provided at the output of the collimating/focusing assembly formed by collimating optics 3, filter 6 and focusing optics 7 to provide detachable connection to optical fiber 8. A distal end 8B of optical fiber 8 provides a source of high-intensity broadband light remote from broadband light source 10.

Due to the nature of fluorescent emission, fluorescent light is not polarized and is generally emitted in all directions. If the collecting optics is located only on the front side of emitting assembly 2, a mirror located at the back of emitting assembly 2 can redirect fluorescence light back through emitting assembly 2. The reflected light joins with divergent beam 5A and is collected by collimating optics 3, increasing optical output. The level of optical output is also increased by the same mirror reflecting stimulus beams 9A, 9B as long as the mirror reflectivity extends from the pump laser wavelength through the emission band. The mirror can be a broadband dielectric coating or a metallic coating deposited on a suitable substrate or a bulk metallic mirror. In some embodiments, a bulk Aluminum or Silver mirror is provided by a polished surface of heat sink 1, which is advantageous due to the high optical reflectivity of Aluminum or Silver at the stimulus wavelength and the emissions band, as well as the high thermal conductivity of Aluminum or Silver.

Referring now to FIG. 2, details of assembly 2 are shown, in accordance with an embodiment of the invention. A bottom face of a Ce:YAG crystal 13 is thermally bonded to heat sink 1 of FIG. 1, by a thermal bonding layer 11, such as a thermal paste, thermal adhesive, or other suitable medium or device having low thermal resistance. A reflector 12A is disposed between crystal 13 and thermal bonding layer 11 to form one side of a light-concentrating cavity. In some embodiments, heat sink 1 may provide reflector 12A, such as when a metal heat sink 1 is optically bonded to crystal 13 with an optically transmissive adhesive. Another set of reflectors 12B disposed on the sides of crystal 13 form other sides of the light-concentrating cavity and still another reflector 12C is disposed on a side of assembly 2 facing pump laser assemblies 4A, 4B to admit stimulus beams 9A,9B and permit divergent light beam 5A to exit. In some alternative configurations, divergent light beam 5A may exit a different face than through reflector 12C, such as one of reflectors 12B on the side of assembly 2. In such a configuration, reflector 12C may be a dichroic surface that is transmissive at the stimulus wavelength and reflective in the emission band, while the side reflector 12B through which divergent light beam 5A exits may be another dichroic surface that is transmissive over the emission band, but reflective at the stimulus wavelength.

Laser diodes generally emit a well polarized optical beam of relatively low optical etendue, even for multimode laser diodes. A minimum polarization ratio of 100:1 is typical for laser diode sources. Since the polarization is well-controlled, in particular embodiments of the invention, stimulus beams 9A, 9B can be arranged to be incident on crystal 13 at the Brewster angle of incidence ($\theta_B$). The polarization of stimulus beams 9A, 9B can be controlled by optical wave plates (half-wave plate, quarter-wave plate) to manipulate the state of polarization of each pump beam without changing the beam shape (transverse intensity profile) or another device producing a combination of total internal reflections in suitably shaped optical materials may be used in order to produce the appropriate phase shift between p- and s-polarized components. Alternatively, a combination of out-of-plane mirrors that change the polarization orientation by Berry phase (topological phase shifts) may be used. In such an implementation, the beam transverse intensity profile will be rotated with the polarization. Finally, the polarization can be controlled by changing the azimuthal orientation of the laser diode junction to change the orientation of the polarization.

The refractive index of Ce:YAG is approximately 1.8 at 450 nm, thus $\theta_B$ is approximately equal to 61°. By providing stimulus beams 9A, 9B incident on the face of crystal 13 with parallel polarization, the Fresnel reflection coefficient at the interface between the air and the face of crystal 13 is substantially zero. Further, the large value of the Brewster angle $\theta_B$ corresponds to a numerical aperture NA=sin $\theta_B$=0.87 or, alternatively, to a solid angle: $\Omega=2\pi$ (1−cos $\theta_B$)=3.2 steradians. Consequently, many pump beams can be distributed around the normal to the face of crystal 13 on which stimulus beams 9A, 9B are incident, which clears a very large solid angle in front of the face of crystal 13 that receives stimulus beams 9A, 9B. Such an arrangement simplifies collection of the fluorescent emissions at the same face of crystal 13, such as the arrangement of collimating optics 3, optical filter 6 and focusing optics 7 as shown in FIG. 1. Such an arrangement has low sensitivity to the angle of incidence since the Fresnel coefficient of reflection remains small for angles of incidence within ±5° of $\theta_B$ and avoids the need for an anti-reflective (AR) coating on the front surface of the crystal. Since the thermal load due to the laser pumping, especially in intensity modulated applications, would require very hard AR coatings to support a large number of thermal cycles, not requiring an AR coating is a significant advantage of the Brewster angle-incident arrangement described above. Such an arrangement also avoids the need for a common optical path of all incoming pump laser beams and outgoing fluorescence light as would otherwise be required in near-normal incidence pumping/collection schemes and/or eliminates the need for beam combiners and beam splitters.

Crystal 13 will generally have relatively poor thermal conductivity. E.g., the thermal conductivity of Ce:YAG is approximately k=17 W/m/K. Therefore, an appropriate management of the heat generated by the laser-pumping is essential to prevent thermal quenching of the fluorescence, which will occur if the internal temperature of crystal 13 reaches approximately 700 K. Although reversible, thermal quenching of the fluorescence will significantly reduce the total output power of broadband light source 10. Therefore, crystal 13 requires good thermal contact with a heat sink/spreader, such as heat sink 1, and/or a cooler. Common metals such as pure aluminum (k=200 W/m/K), copper (k=400 W/m/K), and silver (k=440 W/m/K) display very good thermal conductivities and will provide a suitable material for fabricating heat sink 1. In particular, a Tungsten-Copper (W—Cu) alloy can be used to provide a heat sink/spreader that has a thermal conductivity comparable to Aluminum and a coefficient of thermal expansion (CTE) better matching that of Ce:YAG. Matching of CTE between crystal 13 and heat sink 1 provides a more reliable bond between crystal 13 and heat sink 1 by reducing thermal fatigue of the bond over the number of thermal cycles. In one embodiment, crystal 13 formed as a thin crystal plate, optically polished on both sides. In the thin crystal embodiment, the front surface side of crystal 13 receives both stimulus beams 9A, 9B and emits divergent light beam 5A, while the back of crystal 13 is attached to heat sink 1 for thermal management. Such an embodiment reduces the thermal gradient developed across crystal 13 during operation due to the reduced thickness of crystal 13. Heat sink 1 is also polished to provide optical reflection of both pump beams and fluorescence, i.e. the back of the thin crystal 13 is attached to a reflective surface of heat sink 1, so that emitted light is not lost and so that the pump beams pass again through crystal 13 additionally at least once. In general, aluminum is useful as a heat sink/spreader, since it can be polished to optical quality, and is less subject to oxidation and displays a good reflectivity in the visible part of the spectrum, which includes both pump laser wavelength and fluorescence emission band. Uncoated copper is not suitable according to its low reflectivity in a significant part of the visible spectrum (below 550 nm), which includes the pump laser wavelength. Silver is the best choice in terms of both optical reflectivity and thermal conductivity but is more subject to oxidation except when suitably protected. The optically polished rear surface of the crystal is then bonded to the metal heat spreader using optical glue or any other suitable bounding technique (e.g.: contact bonding). Since both surfaces are optically polished, a very thin bounding layer can be used to provide a suitable thermal contact (negligible thermal resistance) while allowing the passage of both pump and fluorescence light. The thickness of the bounding layer can also be adjusted to compensate the mismatch between the crystal and the heat spreader coefficients of thermal expansion (CTEs).

One or multiple thermo-electric coolers (TECs) such as Peltier elements can be provided to transfer heat from heat sink 1 spreader to the surrounding environment, e.g., via forced-air circulation or convection across the Peltier element hot side heat exchanger, or via a liquid cooling system coupled to the hot side heat exchanger. A temperature sensor such as a thermistor or thermocouple can be thermally coupled to heat sink 1 and connected to a control system to control the temperature of crystal 13. The Peltier elements can alternatively, or in combination be driven according to interval length and magnitude of the pump laser injection current. Multiple Peltier elements and/or multistage Peltier elements can be used with a bulk heat spreader to reduce the temperature of crystal 13.

According to other embodiments of the invention, a clear synthetic CVD diamond layer may be optically-bonded to the front face of crystal 13 using a suitable optical and (transparent) thermal bounding layer. Synthetic chemical vapor deposition (CVD) diamond (k=2000 W/m/K) is the best available material in terms of thermal conductivity with the additional benefit of being optically transparent. In such an arrangement, heat can be removed from both the front and back faces of crystal 13, allowing the use of a higher stimulus beam power density before causing temperature quenching of the fluorescence.

When optimizing the Ce:YAG crystal thickness for an optimal thermal management, the optimal thickness value may correspond to an optical path which is too short for a complete absorption of each pump beam in a single pass through the crystal. In such a case, multiple passes of the pump laser beam will allow reaching an acceptable level of absorption of the pump power. This requires the use of an optical reflector on the rear side of the Ce:YAG crystal. A rear mirror will reflect the residual pump back into the crystal for a second pass. When a double pass is not sufficient, the residual pump beam exiting from the front surface can be reshaped and re-injected into the crystal through the front surface in a manner similar to that encountered in some thin disk laser pumping schemes.

Figure 3:
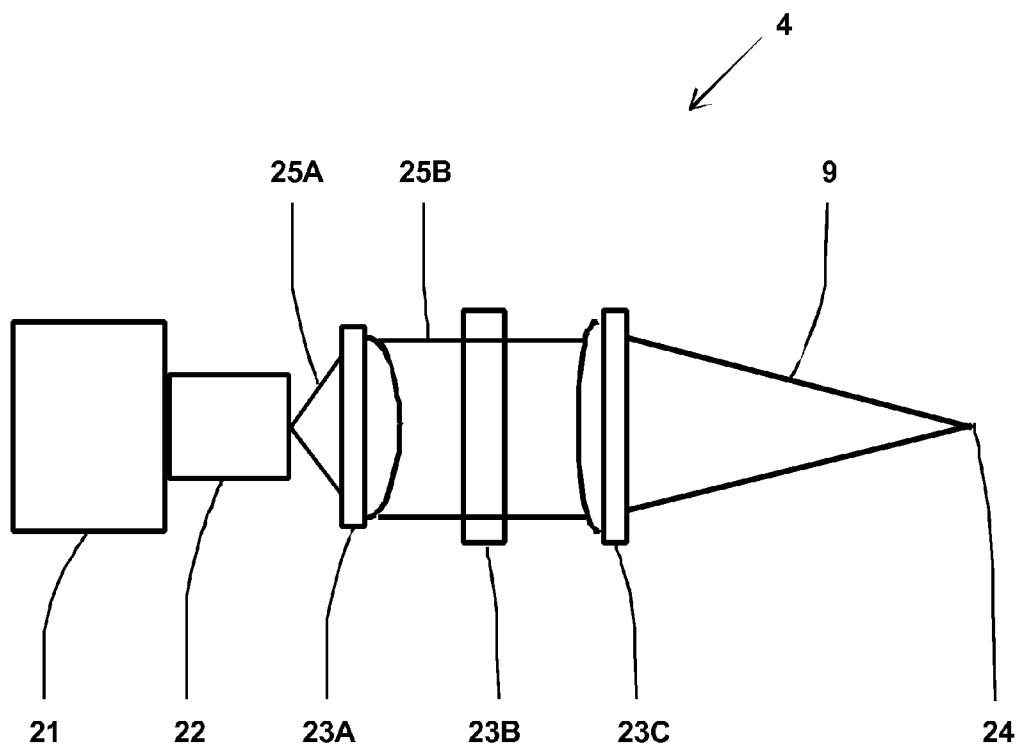
FIG. 3 is block diagram depicting details of a laser assembly 4 that can be used to implement laser assemblies 4A and 4B of FIG. 1.

Referring now to FIG. 3, details of a pump laser assembly 4 that can be used to implement pump laser assemblies 4A, 4B in FIG. 1 is shown in accordance with an embodiment of the invention. A heat sink 21 is thermally bonded to a laser source 22, which in the depicted embodiment is a laser diode. Pump beam collimating optics 23A receive a divergent pump beam 25A from laser source 22 and produce a collimated pump beam 25B. Pump beam shaping optics 23B shape collimated pump beam 25B and pump beam focusing optics 23C focus the shaped pump beam to produce a stimulus beam 9, which is used to provide one of stimulus beams 9A, 9B of FIG. 1. Stimulus beam 9 is focused at a pump beam target 24, which is reflector 12C in the embodiment depicted in FIGS. 1-2.

Laser pumping of Ce:YAG allows a very good control of the pumping zone inside the crystal. Consequently, by properly shaping the transverse intensity distribution of stimulus beams 9A, 9B, all the available pump energy can be directed into in the useful volume of the crystal. Laser pumping also allows a better controlled of the pump distribution within the crystal to alleviate hot spots which will cause temperature quenching of the fluorescence as described above. Stimulus beams 9A, 9B may be shaped by imaging of laser diode junction with an appropriate magnification using a finite conjugate lens, combination of collimating and focusing optical components, including anamorphic optical systems, other optical components such as spherical, aspherical, cylindrical, acylindrical, and graded index lenses, or optical components such as beam shapers designed to transform a Gaussian beam intensity profile to a top-hat profile or specifically designed to produce the optimum transverse intensity profile.

Figure 4:
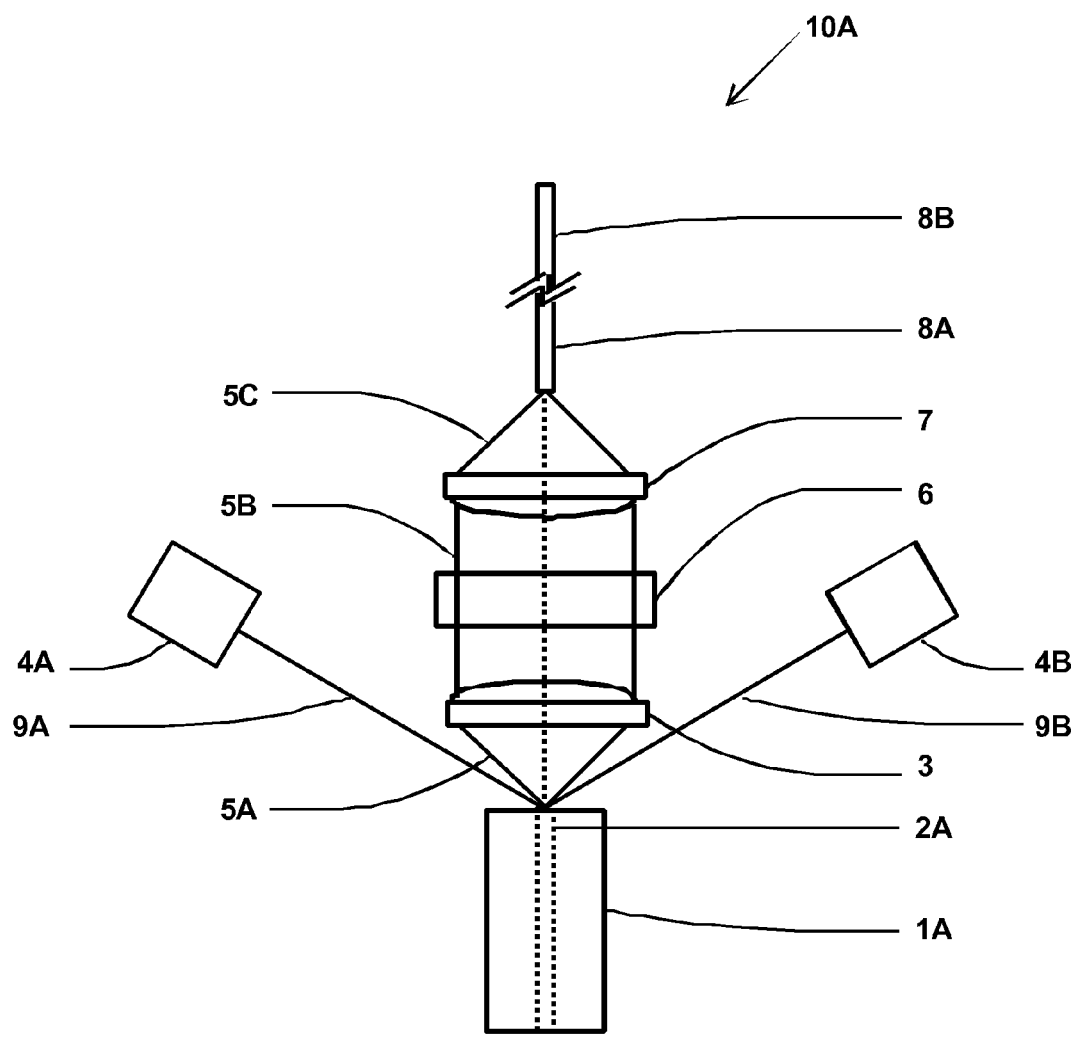
FIG. 4 is a block diagram depicting another exemplary broadband light source 10A.
Figure 5A:
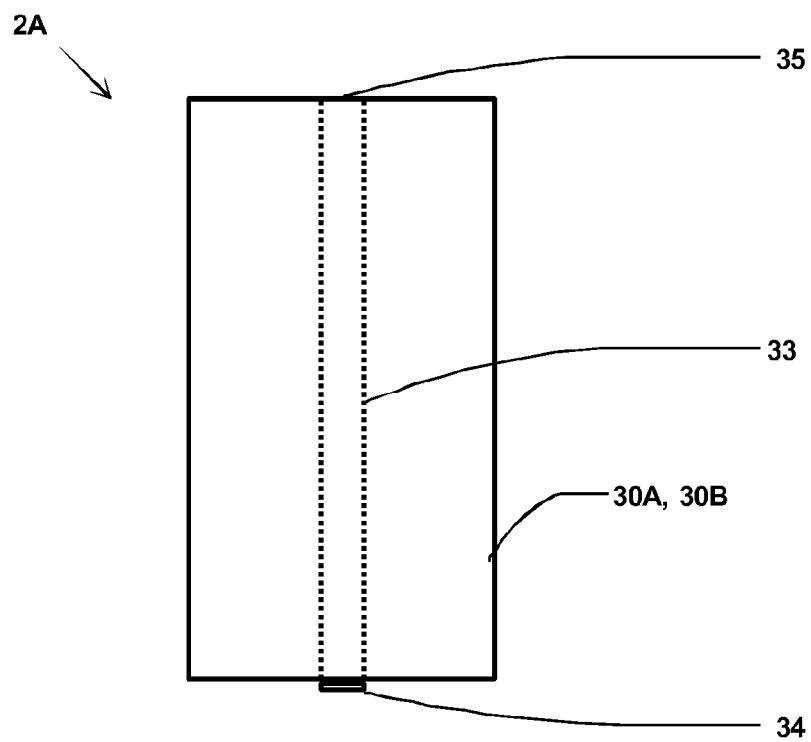
FIGS. 5A-5B are a simplified side view and a top view, respectively, showing details of a crystal assembly 2A of FIG. 4.
Figure 5B:
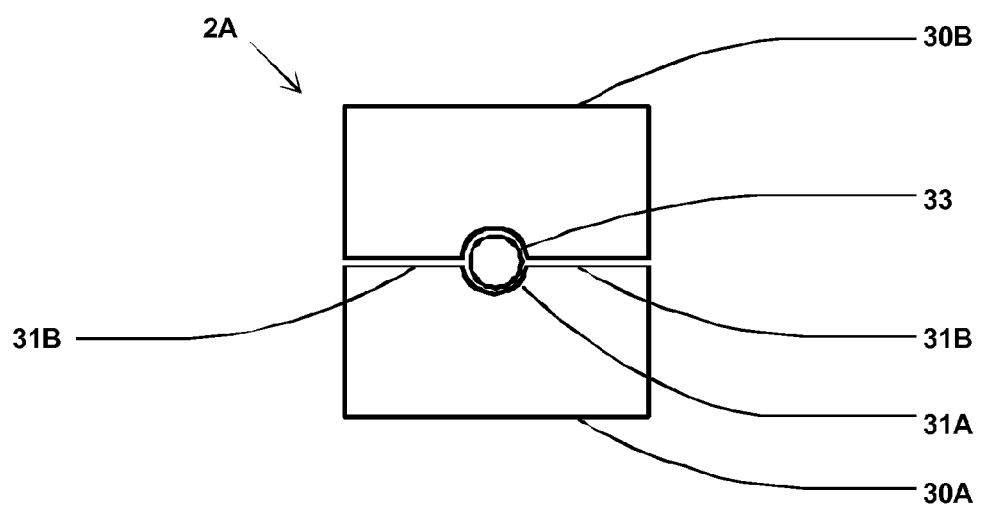

Referring to FIG. 4, a broadband light source 10A is illustrated in accordance with alternative embodiments of the invention. Light source 10A is similar to light source 10 of FIG. 1, so only differences between them will be described below. In light source 10A, an assembly 2A replaces assembly 2 of FIG. 1 and the form and position of a heat sink 1A differs from that of heat sink 1 of FIG. 1, as heat sink 1A is integrated in assembly 2A. Referring additionally to FIGS. 5A-5B, details of assembly 2A are shown. FIG. 5A is a side view of assembly 2A, which shows heat sinks 30A, 30B surrounding a waveguide 33 that serves as a fluorescing body, which may be formed from a Ce:YAG crystal rod, or other suitable body as described above. Waveguide 33 serves as a waveguide at both the stimulus wavelength and over the emission band and may be, for example, 400-500 microns in diameter and a few centimeters long. Waveguide 33 also serves the purpose of distributing the heat generated by absorption of light from stimulus beams 9A, 9B along the length of waveguide 33, which reduces local heating that could otherwise degrade the fluorescent characteristics of waveguide 33. A back reflector 34 is disposed at an end of waveguide 33 opposing the pumping and collection end 35 of waveguide 33. FIG. 5B is a top view of assembly 2A that shows the attachment of heat sinks 30A, 30B with a thermal bonding agent 31B and that waveguide 33 is thermally coupled to heat sinks 30A, 30B with another thermal bonding agent 31A. Both ends of waveguide 33 are generally cut and polished, with back reflector 34 formed by a coating at the back end of waveguide 33 and the front end of waveguide 33 pumped by stimulus beams provided in parallel polarization (p-polarization) incident at Brewster angle $\theta_B$. While the illustrated waveguide 33 has a circular cross-section, the shape of waveguide 33 is only exemplary and other cross-sections may be alternatively employed.

Figure 6A:
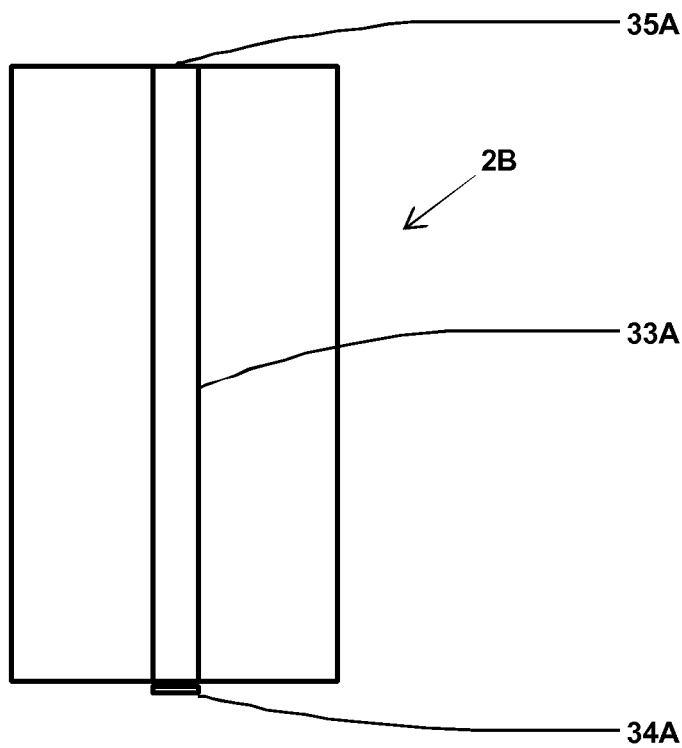
FIGS. 6A-6B are a simplified side view and a top view, respectively, showing details of another crystal assembly 2B that can alternatively be used in place of crystal assembly 2A in light source 10A of FIG. 4.
Figure 6B:
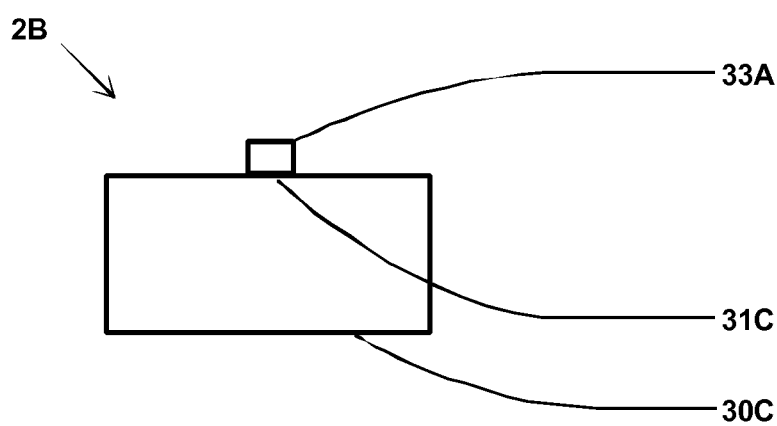

Referring now to FIGS. 6A-6B, an alternative structure of a waveguide/heat sink combination assembly 2B that provides heat sink 1A and assembly 2A in FIG. 4, is shown in accordance with yet another embodiment of the invention. Assembly 2B includes a rectangular crystal waveguide 33A that serves as the fluorescing body, which is thermally bonded with thermal bonding agent 31C to a heat sink 30C. A back reflector 34A is included as in the embodiment depicted in FIGS. 5A-5B at the end of waveguide 33A that is opposite pumping and collection end 35A of waveguide 33A.

While the invention has been particularly shown and described with reference to the preferred embodiment thereof, it will be understood by those skilled in the art that the foregoing and other changes in form, and details may be made therein without departing from the spirit and scope of the invention.

What is claimed:

1. A broadband incoherent light source having a high spectral radiance for providing a broadband illumination output beam, comprising:
    a body having a material doped to have a fluorescent property when stimulated at a stimulus wavelength, wherein the body provides or is disposed in a light-concentrating cavity;
    one or more lasers for producing a corresponding one or more stimulus beams having a wavelength substantially equal to the stimulus wavelength, wherein the one or more stimulus beams are directed at one or more faces of the body to cause the body to emit light in an emission band, wherein the one or more stimulus beams are parallel polarized with respect to their corresponding one of the one or more faces of the body on which they are incident, and wherein the one or more stimulus beams are directed at the corresponding one of the faces of the body on which they are incident at angles substantially equal to a Brewster angle of an interface between the body and a surrounding media, whereby the one or more lasers are positioned outside of one or more projected volumes extending from the one or more faces of the body; and
    a light collector optically coupled to an output face of the body for producing the broadband illumination output beam by collecting at least a portion of the light emitted by the body.

2. The broadband light source of claim 1, wherein the lasers are laser diodes.

3. The broadband light source of claim 1, wherein the stimulus wavelength is between 440-480 nm.

4. The broadband light source of claim 1, wherein the stimulus wavelength lies in an optical absorption band of the body.

5. The broadband light source of claim 1, wherein the body is a solid-state matrix doped with a doping agent.

6. The broadband light source of claim 5, wherein the body is a Cerium-doped Yttrium-aluminum-garnet (Ce:YAG) crystal.

7. The broadband light source of claim 1, further comprising one or more reflectors formed on or attached to a corresponding one or more faces of the body for providing the light-concentrating cavity.

8. The broadband light source of claim 7, wherein one of the reflectors is a back reflector formed on or attached to a first face of the body opposing a second face that receives at least one of the stimulus beams, wherein the stimulus beam is reflected by the back reflector so that the stimulus beam passes through the body multiple times.

9. The broadband light source of claim 7, wherein at least one of the one or more reflectors is a dichroic reflector having high reflectivity in the emission band and high transmissivity in the stimulus band, and wherein at least one of one or more stimulus beams is directed through the dichroic surface into the body.

10. The broadband light source of claim 7, wherein at least one of the one or more reflectors forms a heat sink for dissipating thermal energy generated by the one or more stimulus beams being directed at the body.

11. The broadband light source of claim 1, wherein the body is a thin layer disposed on a reflector forming a face of the light-concentrating cavity, and wherein the body has a thickness so that negligible thermal gradient is developed.

12. The broadband light source of claim 1, wherein the body is a waveguide and wherein the waveguide is thermally bonded to a heat sink along a length of the waveguide to remove heat from the waveguide.

13. The broadband light source of claim 1, wherein the light collector comprises:
    a collimator for collimating the output beam; and
    a focusing system for focusing the output beam.

14. The broadband light source of claim 13, further comprising a coupler for coupling an output of the light collector to an optical fiber input.

15. The broadband light source of claim 1, wherein the stimulus beams have a shaped transverse intensity distribution, whereby a distribution of energy of the stimulus beams within the body is controlled.

16. The broadband light source of claim 1, wherein the light collector comprises an optical filter for shaping a spectrum of the broadband illumination output beam.

17. A broadband light source having a high spectral radiance for providing a broadband illumination output beam, comprising:
    a Ce:YAG crystal having a fluorescent property when stimulated at a stimulus wavelength;

one or more reflectors formed on or affixed to faces of the crystal provides forming a light-concentrating cavity with the crystal disposed therein;
one or more laser diodes for producing a corresponding one or more stimulus beams having a wavelength substantially equal to the stimulus wavelength, wherein the one or more stimulus beams are directed a one or more faces of the body to cause the crystal to emit light in an emission band, wherein the one or more stimulus beams are parallel polarized with respect to their corresponding one of the one or more faces of the body on which they are incident, and wherein the one or more stimulus beams are directed at the corresponding one of the faces of the body on which they are incident at angles substantially equal to a Brewster angle of an interface between the body and a surrounding media, whereby the one or more laser diodes are positioned outside of one or more projected volumes extending from the one or more faces of the body;
a heat sink thermally bonded to a bottom face of the crystal for removing heat from the crystal; and
a light collector optically coupled to the top face of the crystal for producing the broadband illumination output beam by collecting at least a portion of the light emitted by the crystal.

18. A method of generating broadband light at a high spectral radiance, the method comprising:
disposing a body in a light-concentrating cavity, wherein the body is formed from a material doped to have a fluorescent property when stimulated at a stimulus wavelength;
optically pumping the body with one or more lasers that producing a corresponding one or more stimulus beams having a wavelength substantially equal to the stimulus wavelength, wherein the one or more stimulus beams are directed at one or more faces of the body to cause the body to emit light in an emission band, and wherein the one or more stimulus beams are parallel polarized with respect to their corresponding one of the one or more faces of the body on which they are incident, and wherein the one or more stimulus beams are directed at the corresponding one of the faces of the body on which they are incident at angles substantially equal to a Brewster angle of an interface between the body and a surrounding media, whereby the one or more lasers are positioned outside of one or more projected volumes extending from the one or more faces of the body; and
collecting at least a portion of the light emitted by the body to produce the broadband illumination output beam.

19. The method of claim 18, wherein the stimulus wavelength is between 440-460 nm.

20. The method of claim 18, wherein the stimulus wavelength lies in an optical absorption band of the body.

21. The method of claim 18, wherein the body is a solid-state matrix doped with a doping agent.

22. The method of claim 21, wherein the body is a Cerium-doped Yttrium-aluminum-garnet (Ce:YAG) crystal.

23. The method of claim 18, wherein the body is a waveguide and wherein the heat-sink is disposed around the waveguide and thermally bonded thereto along a length of the waveguide to remove heat from the waveguide.

24. A broadband incoherent light source having a high spectral radiance for providing a broadband illumination output beam, comprising:
a body having a material doped to have a fluorescent property when stimulated at a stimulus wavelength, wherein the body provides or is disposed in a light-concentrating cavity provided by one or more reflectors formed on or attached to a corresponding one or more faces of the body;
one or more lasers for producing a corresponding one or more stimulus beams having a wavelength substantially equal to the stimulus wavelength, wherein the one or more stimulus beams are directed at one or more of the faces of the body to cause the body to emit light in an emission band, and wherein at least one of the one or more reflectors forms a heat sink for dissipating thermal energy generated by the one or more stimulus beams being directed at the body; and
a light collector optically coupled to an output face of the body for producing the broadband illumination output beam by collecting at least a portion of the light emitted by the body.

25. A method of generating broadband light at a high spectral radiance, the method comprising:
disposing a body in a light-concentrating cavity provided by one or more reflectors formed on or attached to a corresponding one or more faces of the body, wherein the body is formed from a material doped to have a fluorescent property when stimulated at a stimulus wavelength;
optically pumping the body with one or more lasers that produce a corresponding one or more stimulus beams having a wavelength substantially equal to the stimulus wavelength, wherein the one or more stimulus beams are directed at one or more of the faces of the body to cause the body to emit light in an emission band;
dissipating thermal energy generated by the one or more stimulus beams being directed at the body by a heat sink formed by at least one of the one or more reflectors; and
collecting at least a portion of the light emitted by the body to produce the broadband illumination output beam.

26. A broadband incoherent light source having a high spectral radiance for providing a broadband illumination output beam, comprising:
a body having a material doped to have a fluorescent property when stimulated at a stimulus wavelength, wherein the body provides or is disposed in a light-concentrating cavity provided by one or more reflectors formed on or attached to a corresponding one or more faces of the body;
one or more lasers for producing a corresponding one or more stimulus beams having a wavelength substantially equal to the stimulus wavelength, wherein the one or more stimulus beams are directed at one or more faces of the body to cause the body to emit light in an emission band, wherein at least one of the one or more reflectors is a dichroic reflector having high reflectivity in the emission band and high transmissivity in the stimulus band, and wherein at least one of one or more stimulus beams is directed through the dichroic surface into the body; and
a light collector optically coupled to an output face of the body for producing the broadband illumination output beam by collecting at least a portion of the light emitted by the body.

27. A method of generating broadband light at a high spectral radiance, the method comprising:
disposing a body in a light-concentrating cavity provided by one or more reflectors formed on or attached to a corresponding one or more faces of the body, wherein the body is formed from a material doped to have a fluorescent property when stimulated at a stimulus wavelength;

optically pumping the body with one or more lasers that produce a corresponding one or more stimulus beams having a wavelength substantially equal to the stimulus wavelength, wherein the one or more stimulus beams are directed at one or more faces of the body to cause the body to emit light in an emission band, wherein at least one of the one or more reflectors is a dichroic reflector having high reflectivity in the emission band and high transmissivity in the stimulus band, and wherein at least one of one or more stimulus beams is directed through the dichroic surface into the body; and collecting at least a portion of the light emitted by the body to produce the broadband illumination output beam.

\* \* \* \* \*

UNITED STATES PATENT AND TRADEMARK OFFICE
CERTIFICATE OF CORRECTION

PATENT NO. : 9,933,605 B2  
APPLICATION NO. : 14/538026  
DATED : April 3, 2018  
INVENTOR(S) : Rousseau et al.

Page 1 of 1

It is certified that error appears in the above-identified patent and that said Letters Patent is hereby corrected as shown below:

In the Claims

Column 9, Lines 7-8, "wherein the one or more stimulus beams are directed a one or more faces of the body" should read -- wherein the one or more stimulus beams are directed at one or more faces of the body --.

Signed and Sealed this
Fifteenth Day of May, 2018

Andrei Iancu
*Director of the United States Patent and Trademark Office*